(12) United States Patent
Björn et al.

(10) Patent No.: US 9,241,441 B2
(45) Date of Patent: Jan. 26, 2016

(54) ROBOTIC LAWNMOWER

(75) Inventors: Jonathan Björn, Jönköping (SE); Patrik Jägenstedt, Tenhult (SE)

(73) Assignee: HUSQVARNA AB, Huskvarna (SE)

( * ) Notice: Subject to any disclaimer, the term of this patent is extended or adjusted under 35 U.S.C. 154(b) by 0 days.

(21) Appl. No.: 14/380,508

(22) PCT Filed: Feb. 22, 2012

(86) PCT No.: PCT/SE2012/050192
§ 371 (c)(1),
(2), (4) Date: Aug. 22, 2014

(87) PCT Pub. No.: WO2013/125991
PCT Pub. Date: Aug. 29, 2013

(65) Prior Publication Data
US 2015/0045948 A1 Feb. 12, 2015

(51) Int. Cl.
*A01D 34/00* (2006.01)
*H01H 36/00* (2006.01)
*H01H 27/00* (2006.01)
*H03K 17/97* (2006.01)

(52) U.S. Cl.
CPC ............ *A01D 34/008* (2013.01); *H01H 27/00* (2013.01); *H01H 36/00* (2013.01); *H01H 36/0066* (2013.01); *H03K 17/97* (2013.01)

(58) Field of Classification Search
CPC . A01D 34/008; H01H 27/00; H01H 36/0066; H01H 36/00; H03K 17/97
See application file for complete search history.

(56) References Cited

U.S. PATENT DOCUMENTS

| | | |
|---|---|---|
| 5,085,043 A | 2/1992 | Hess et al. |
| 5,738,058 A | 4/1998 | Gotto |
| 6,018,937 A | 2/2000 | Shimada et al. |
| 6,223,571 B1 | 5/2001 | Rector |
| 6,339,735 B1 * | 1/2002 | Peless et al. .............. 701/23 |

(Continued)

FOREIGN PATENT DOCUMENTS

| | | |
|---|---|---|
| CN | 101635214 A | 1/2010 |
| CN | 102232331 A | 11/2011 |
| GB | 2342787 A | 4/2000 |

OTHER PUBLICATIONS

Robot Mower User Manual, printed on May 11, 2011 from http://www.tianchen-cn.com/en/UpLoadFile/201142014292046564.pdf, all enclosed pages cited.

(Continued)

*Primary Examiner* — Khoi Tran
*Assistant Examiner* — Robert Nguyen
(74) *Attorney, Agent, or Firm* — Nelson Mullins Riley & Scarborough LLP

(57) ABSTRACT

A robotic lawnmower 1 is provided, having a deactivated state, a stand by state and an activated state. A removable disabling device 3 is arranged to be positioned in a first, a second, and a third position in a retainer 5 of the robotic lawnmower 1. The first position constitutes an off position in which the robotic lawnmower 1 is in a deactivated state. The second position constitutes a stand by position in which the robotic lawnmower 1 is in a stand by state. The third position constitutes an on position in which the robotic lawnmower 1 is in an activated state. The present invention also relates to a disabling device 3 arranged to be positioned in a retainer 5 of a robotic lawnmower 1 according to the invention.

16 Claims, 3 Drawing Sheets

(56) References Cited

U.S. PATENT DOCUMENTS

| | | | |
|---|---|---|---|
| 7,318,493 B2 * | 1/2008 | Medina | B60K 1/02 |
| | | | 180/167 |
| D566,136 S * | 4/2008 | Green | D15/14 |
| 7,540,132 B2 | 6/2009 | Shimada et al. | |
| 7,677,344 B2 * | 3/2010 | Medina | A01D 43/07 |
| | | | 180/167 |
| 7,886,706 B2 | 2/2011 | Grybush | |
| 8,706,297 B2 * | 4/2014 | Letsky | 700/245 |
| 2003/0144774 A1 | 7/2003 | Trissel et al. | |
| 2005/0274098 A1 | 12/2005 | Weber et al. | |
| 2008/0223012 A1 | 9/2008 | Rosa et al. | |
| 2010/0162674 A1 | 7/2010 | Eaton et al. | |
| 2011/0234153 A1 | 9/2011 | Abramson | |

OTHER PUBLICATIONS

International Search Report and Written Opinion of PCT/SE2012/050192 mailed Nov. 14, 2012, all enclosed pages cited.

Chapter I International Preliminary Report on Patentability of PCT/SE2012/050192 mailed Aug. 26, 2014, all enclosed pages cited.

* cited by examiner

ROBOTIC LAWNMOWER

TECHNICAL FIELD

The present invention relates to a robotic lawnmower. The present invention further relates to a disabling device of a robotic lawnmower.

BACKGROUND

A robotic lawnmower requires two basic functions; start and stop. For safety reasons it is also an advantage if the lawnmower cannot be operated by an unauthorized user. In the technical field of robotic lawnmowers, these functions have been handled via a stop button in combination with a keyboard and display for pin-code input. These components add complexity to the lawnmower and increase manufacturing costs. Moreover, negligent handling of the pin-code may lead to an unauthorized user is able to start the lawnmower without permission. Also, a robotic lawnmower is especially liable to be stolen and a secure anti-theft system is therefore required. Further, when a user turns off a robotic lawnmower, it is an advantage if the lawnmower actively stops driving of rotating cutting blades and stores operation data being gathered during the run. The stopping of the driving and the storing of operation data requires electricity. Therefore, in order to achieve the stopping of the driving and the storing of operation data, the electricity must not directly be turned off when the lawnmower is turned off by a user.

Therefore, there is a need for a disabling device for a robotic lawnmower which is easy to use and enhances the safety of the handling of the robotic lawnmower.

SUMMARY

An object of the present invention is to provide a robotic lawnmower which is easy to handle, specifically during starting-up of the robotic lawnmower and during shutting down of the robotic lawnmower.

According to an aspect of the invention, the object is achieved by a robotic lawnmower having a deactivated state, a stand by state and an activated state. A removable disabling device is arranged to be positioned in a first, a second, and a third position in a retainer of the robotic lawnmower. The first position constitutes an off position in which the robotic lawnmower is in a deactivated state. The second position constitutes a stand by position in which the robotic lawnmower is in a stand by state. The third position constitutes an on position in which the robotic lawnmower is in an activated state.

Since the robotic lawnmower is controlled via the positioning of the removable disabling device, the robotic lawnmower is easy to handle, specifically during starting-up of the robotic lawnmower and during shutting down of the robotic lawnmower. As a result, the above mentioned object is achieved.

Further, since the disabling device is removable from the robotic lawnmower, a theft-proof lawnmower is provided in the sense that the robotic lawnmower is not operational without the disabling device.

Furthermore, since the disabling device is needed in order to transition the robotic lawnmower to the activated state, unauthorized use of the lawnmower is prevented. Thus, the safety of the handling of the robotic lawnmower may be increased.

Also, the position of the disabling device may be visible to a user of the robotic mower. Thereby, the user may distinguish if the lawnmower is in the activated state, the stand by state or the deactivated state.

Each of the first, the second, and/or the third position may comprise one position only. As an alternative, one or more of the first, the second, and/or the third position may comprise one or more sub-positions. For example, the third position may comprise three sub-positions. In such embodiments, the robotic lawnmower is in an activated state in all sub-positions comprised in the third position. Consequently, in embodiments wherein one or more of the first, the second, and/or the third position comprises one or more sub-positions, the robotic lawnmower may be in the deactivated state, the stand by state or the activated state when the disabling device is positioned in a sub-position comprised in the first, the second, or the third position. Due to the use of sub-positions, the safety of the handling of the robotic lawnmower may be increased.

According to some embodiments, the robotic lawnmower comprises a processing unit. The processing unit may be connected to at least one sensor device arranged to sense a position of the disabling device.

In such embodiments, the sensor device may sense the position of the disabling device to thereby provide a signal indicative of the position of the disabling device to the processing unit. Thereby, information regarding the position of the disabling device may be provided to the processing unit. On the basis of this information, the processing unit may set the robotic lawnmower in the deactivated state, the stand by state or the activated state. The sensor device may comprise one or more electro-mechanical switches, such as micro switches, arranged to be actuated dependent upon the position of the disabling device.

According to some embodiments, the disabling device is equipped with at least one magnet, and wherein the at least one sensor device is a sensor device arranged to sense a magnetic field. In such embodiments, the at least one sensor device may comprise one or more sensor devices arranged to sense a magnetic field. Such at least one sensor device may sense the presence of, and/or a distance to, the at least one magnet of the disabling device to thereby provide at least one signal indicative of a position of the disabling device to the processing unit. According to some embodiments, the processing unit may be connected to two sensor devices arranged to sense a magnetic field to thereby sense a position of a magnet arranged in the disabling device in order to sense the position of the disabling device.

The robotic lawnmower may comprise an electric motor and a working tool, wherein the electric motor is arranged to drive the working tool in the activated state. When the electric motor drives the working tool, in the activated state, the working tool of the robotic lawnmower may perform cutting of grass. The electric motor may be powered by means of a battery or batteries, wherein the battery or batteries may be rechargeable. The robotic lawnmower may further comprise a set of driving wheels, wherein the driving wheels may be driven by one or more electric driving motors. The battery or batteries may also power the electric driving motors, as well as the processing unit and other electrical components of the robotic lawnmower. The robotic lawnmower may be provided with one or more sensors, and/or one or more transmitters/receivers connected to the processing unit. With information retrieved from one or more of these components, the processing unit may control a movement of the robotic lawnmower, e.g. by means of controlling the driving motors, to thereby guide the robotic lawnmower e.g. in a cutting path.

According to some embodiments, the processing unit is arranged to gather operation data of the robotic lawnmower in the activated state. In such embodiments, the operation data may comprise data regarding the batteries state of charge, a distance traveled during the activated state, a time period during which the robotic lawnmower has been in the activated state, a size of an area being covered by the robotic lawnmower during the activated state, a distance to a charging station, a resistance measurement of the working tool, an error log, etc.

In the stand by state, the robotic lawnmower may be adapted to stop the driving of the working tool and to stop the driving of the electric driving motors powering the driving wheels. However, in the stand by state, the processing unit may remain activated.

According to some embodiments, the processing unit is adapted to save the operation data in the stand by state. The operation data may be saved on a memory of the processing unit. Such saved information may be read by the processing unit during a subsequent start-up phase of the robotic lawnmower to thereby set driving parameters of the robotic lawnmower. Such driving parameters may be parameters regarding a cutting path, a speed of rotation of the working tool, a speed of the robotic lawnmower, a decision on returning to the charging station, an error log, etc. Thus, during an activated state, the robotic lawnmower may utilize operation data being gathered in a previous activated state.

According to some embodiments, the processing unit is arranged to provide at least a part of the operation data to a user of the robotic lawnmower, via an interface, in the stand by state. Thus, the processing unit may provide operation data being gathered during an activated state, to a user of the robotic lawnmower, in the stand by state. Thereby, a user of the robotic lawnmower may be provided with information being gathered during running of the robotic lawnmower. The interface may comprise one or more interface components, such as a light emitting diode LED, a speaker, a summer, a display or an external unit.

The processing unit may also be arranged to provide operation data to a user of the robotic lawnmower, via the interface, being gathered during the stand by state. Such operation data may for example consist of the battery or batteries state of charge, error messages etc. Thus, a user may e.g. on the basis of such operation data judge whether the battery or batteries needs to be charged or whether the robotic lawnmower needs to be serviced.

According to some embodiments, the robotic lawnmower is arranged to stop the driving of the working tool in the stand by state. The stopping of the driving of the working tool in the stand by state may be actively performed e.g. by a reversal of an electric voltage supplied to the electric motor or by short-circuiting the electric motor or by using a separate brake system. Due to the stopping of the driving of the working tool in the stand by state, the safety of handling of the robotic lawnmower may be increased. The stopping of the driving of the working tool in the stand by state may be controlled by the processing unit.

According to some embodiments, the retainer is arranged to lock the disabling device to the robotic lawnmower in the second and third positions. As stated above, the second position constitutes a stand by position in which the robotic lawnmower is in a stand by state, and the third position constitutes an on position in which the robotic lawnmower is in an activated state. Therefore, the locking of the disabling device in these positions may prevent the disabling device from falling out from the retainer of the robotic lawnmower during the activated state and the stand by state. Also, the locking of the disabling device in these positions may prevent the disabling device from being unintentionally displaced from these positions.

According to some embodiments, the disabling device is removable from the robotic lawnmower in the first position. Since the first position constitutes an off position in which the robotic lawnmower is in a deactivated state, according to these embodiments, the disabling device is removable from the robotic lawnmower in the deactivated state. In the deactivated state, all electronics of the robotic lawnmower may be turned off. Removal of the disabling device may prevent the robotic lawnmower from being transitioned to the stand by state and the activated state. Thus, removal of the disabling device may prevent theft of the robotic lawnmower and may prevent unauthorized use of the robotic lawnmower. The prevention of unauthorized use of the robotic lawnmower may increase the safety of the handling of the robotic lawnmower.

According to some embodiments, the robotic lawnmower comprises a button, wherein the button is linked to the retainer such that, in the third position, the disabling device is displaced from the third position to the second position when the button is pressed or touched. The button may be linked to the retainer via a mechanical connection, and/or an electrical connection. As previously stated, the third position constitutes an on position in which the robotic lawnmower is in an activated state, and the second position constitutes a stand by position in which the robotic lawnmower is in a stand by state. Thus, the displacement of the disabling device from the third position to the second position changes the state of the robotic lawnmower from the activated state to the standby state. After the transition, and/or during the transition, from the activated state to the standby state, the processing unit may save operation data of the robotic lawnmower being gathered during the activated state and may provide at least a part of the operation data to a user of the robotic lawnmower, via an interface. Also, after the transition, and/or during the transition, from the activated state to the standby state, the robotic lawnmower may be arranged to stop the driving of the working tool. Accordingly, the displacement of the disabling device, from the third to the second position, when the button is pressed or touched, may allow at least one of the above mentioned actions to be performed.

According to some embodiments, the disabling device may be prevented from being displaced directly from the third position to the first position. Thus, according to these embodiments, the robotic lawnmower may be prevented from being transitioned directly from the activated state to the deactivated state. As a result, the robotic lawnmower and/or the processing unit may perform at least one of the above mentioned actions when transitioned from the activated state.

According to some embodiments, the button is linked to the retainer such that, in the second position, the disabling device is displaced from the second position to the first position when the button is pressed or touched. As previously stated, the second position constitutes a stand by position in which the robotic lawnmower is in a stand by state, and the first position constitutes an off position in which the robotic lawnmower is in a deactivated state. Thus, the displacement of the disabling device from the second position to the first position changes the state of the robotic lawnmower from the stand by state to the deactivated state. When the robotic lawnmower is in the deactivated state, the disabling device may be removed from the robotic lawnmower.

According to a further aspect of the invention there is provided a disabling device arranged to be positioned in a retainer of a robotic lawnmower according to aspects and embodiments disclosed herein. The disabling device may be equipped with key-like features such as a key-profile, or a data-chip, such that a particular robotic lawnmower is associated with a particular disabling device, wherein the particular robotic lawnmower only can be transitioned to the stand by state or the activated state with the associated disabling device.

Further features of, and advantages with, the present invention will become apparent when studying the appended claims and the following detailed description. Those skilled in the art will realize that different features of the present invention may be combined to create embodiments other than those described in the following, without departing from the scope of the present invention, as defined by the appended claims.

BRIEF DESCRIPTION OF THE DRAWINGS

The various aspects of the invention, including its particular features and advantages, will be readily understood from the following detailed description and the accompanying drawings, in which.

DETAILED DESCRIPTION

The present invention will now be described more fully with reference to the accompanying drawings, in which example embodiments are shown. However, this invention should not be construed as limited to the embodiments set forth herein. Disclosed features of example embodiments may be combined as readily understood by one of ordinary skill in the art to which this invention belongs. Like numbers refer to like elements throughout.

Well-known functions or constructions will not necessarily be described in detail for brevity and/or clarity.

Figure 1:
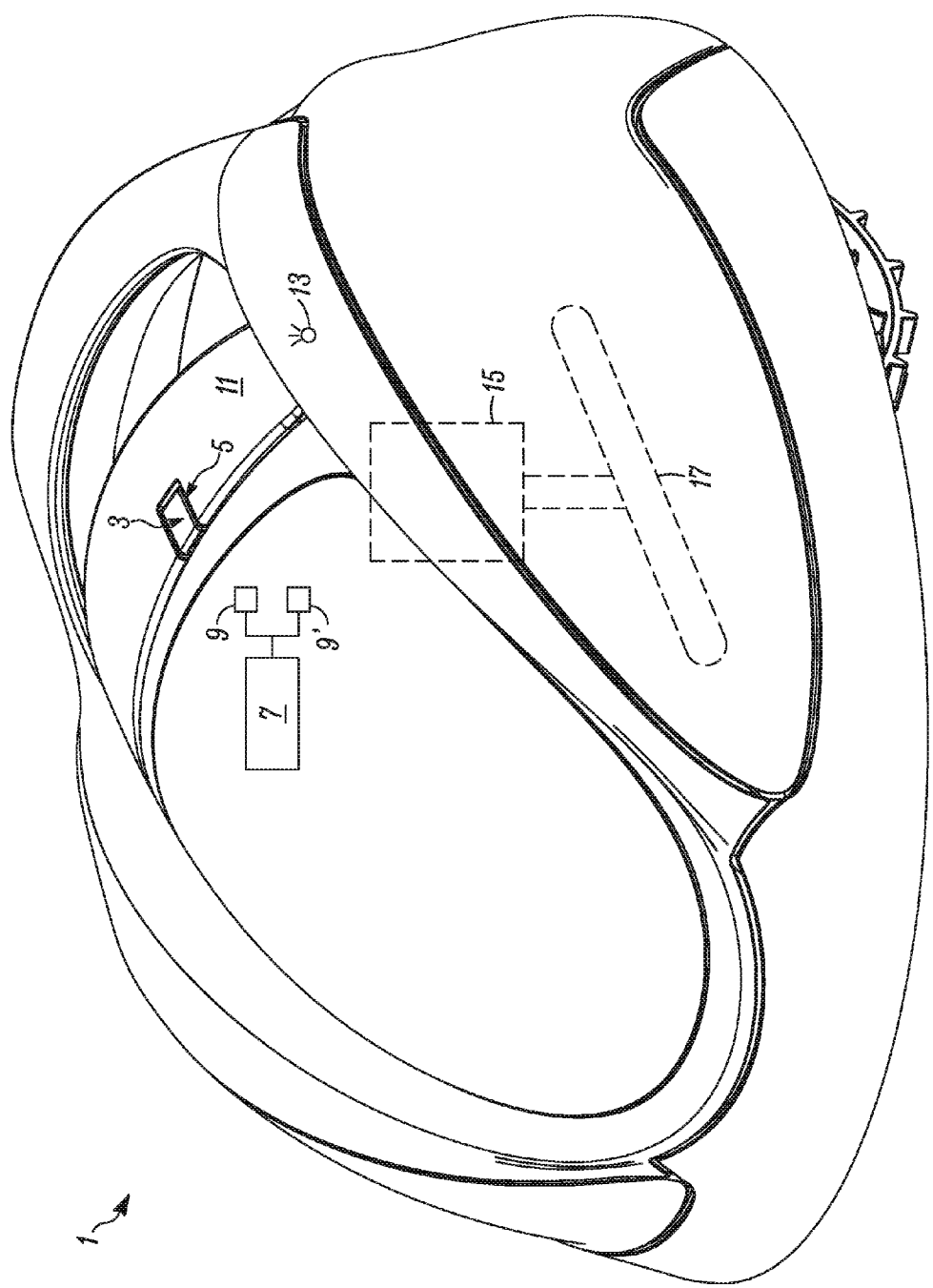
FIG. 1 illustrates a robotic lawnmower according to some embodiments.

FIG. 1 illustrates a robotic lawnmower 1 according to some embodiments. The robotic lawnmower 1 has a deactivated state, a stand by state and an activated state. A removable disabling device 3 is arranged to be positioned in a first, a second, and a third position in a retainer 5 of the robotic lawnmower 1. The first position constitutes an off position in which the robotic lawnmower 1 is in a deactivated state. The second position constitutes a stand by position in which the robotic lawnmower 1 is in a stand by state. The third position constitutes an on position in which the robotic lawnmower 1 is in an activated state.

The robotic lawnmower 1 comprises an electric motor 15 and a working tool 17, wherein the electric motor 15 is arranged to drive the working tool 17 in the activated state. The robotic lawnmower 1 may comprise one or more batteries arranged to supply electric power to the electric motor 15. The battery or batteries may be rechargeable. The robotic lawnmower 1 may further comprise a set of wheels, wherein at least one wheel may be driven by an electric motor to thereby apply a driving force to the robotic lawnmower. According to some embodiments, the robotic lawnmower comprises at least two wheels driven by an electric motor. The at least two wheels may be driven by an electric motor each. The electric motors may be regulated such that a difference angular velocity of those wheels achieves a steering effect of the robotic lawnmower 1. The working tool 17 may comprise one or more rotating cutting blades. The working tool 17 may be directly driven by the electric motor 15 or indirectly driven by the electric motor 15, e.g. via a transmission such as a belt drive or a set of gears.

The robotic lawnmower 1 may comprise a processing unit 7 wherein the processing unit 7 is connected to at least one sensor device 9, 9' arranged to sense a position of the disabling device 3. The at least one sensor device 9, 9' may be sensor device arranged to sense a magnetic field and the disabling device 3 may be provided with a magnet. According to some embodiments, the processing unit 7 may be connected to two sensor devices 9, 9' arranged to sense a magnetic field to thereby sense a position of a magnet arranged in the disabling device 5 in order to sense a position of the disabling device 5. The processing unit 7 may be arranged to gather operation data of the robotic lawnmower 1 in the activated state and may further be adapted to save the operation data in the stand by state. The operation data may be saved on a memory and may be used in a subsequent start-up of the robotic lawnmower 1. The processing unit 7 may be arranged to provide at least a part of the operation data to a user of the robotic lawnmower 1, via an interface 13, in the stand by state. In FIG. 1, the interface 13 is illustrated in the form of a light emitting diode, LED. However, the interface 13 may comprise one or more LED:s, or a display, or a speaker, or a summer, or any other type of interface capable of providing operation data of the robotic lawnmower 1 to a user.

Figure 2A:
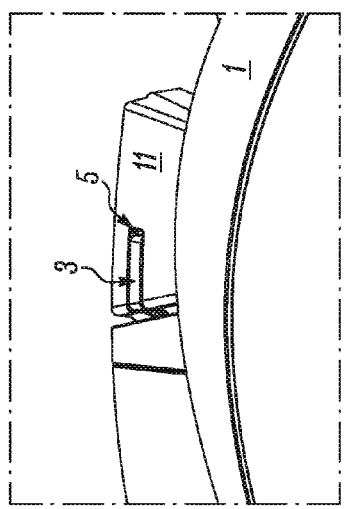
FIGS. 2a-c illustrate a disabling device positioned in a third, a second, and a first position in a retainer of a robotic lawnmower according to some embodiments.
Figure 2B:
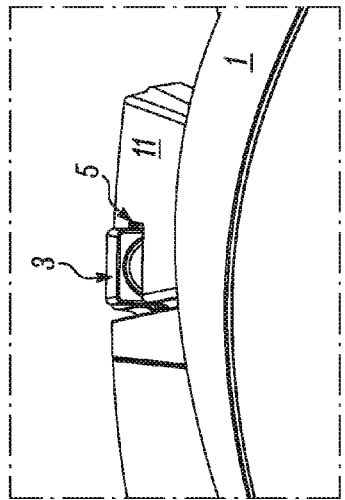
Figure 2C:
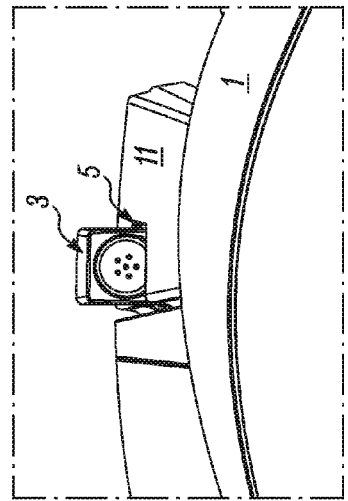

FIGS. 2a-c illustrate a disabling device 3 positioned in a third, a second and a first position in a retainer 5 of a robotic lawnmower 1 according to some embodiments. In FIG. 2a, the disabling device 3 is illustrated in the third position. In FIG. 2b, the disabling device 3 is illustrated in the second position. In FIG. 2c, the disabling device 3 is illustrated in the first position. A button 11 is provided, wherein the button 11 may be linked to the retainer 5 such that, when the disabling device 3 is positioned in the third position, the disabling device is displaced from the third position to the second position when the button 11 is pressed or touched. Also, the button 11 may be linked to the retainer 5 such that, when the disabling device 3 is positioned in the second position, the disabling device is displaced from the second position to the first position when the button 11 is pressed or touched. Thus, in order to displace the disabling device 3 from the third position to the first position, the button 11 may have to be pressed or touched twice. Accordingly, the disabling device 3 may be prevented from being displaced directly from the third position to the first position. As a result, the robotic lawnmower 1 may be prevented from being transitioned directly from the activated state to the deactivated state. Thus, the robotic lawnmower 1 has to be transitioned to the stand by state before the deactivated state may be reached. As a result, the robotic lawnmower 1 and/or the processing unit 7 may have time to perform actions before the robotic lawnmower 1 is transitioned to the deactivated state.

In the first position, the disabling device 3 is removable from the robotic lawnmower 3. As previously stated, the robotic lawnmower 1 is in a deactivated state when the disabling device 3 is positioned in the first position. When the disabling device 3 is removed from the retainer 5 of the robotic lawnmower 1, the robotic lawnmower 1 is maintained in the deactivated state.

In order to use the lawnmower 1, a user may position the disabling device 3 in the first position in the retainer 5. By pressing the disabling device 3 in a direction from the first position to the second position, the disabling device 3 may be displaced from the first position to the second position. When being positioned in the second position, a user may press the disabling device 3 in a direction from the second position to the third position to thereby displace the disabling device 3 from the second position to the third position. As an alternative, in the second position, the user may press the button 11 to displace the disabling device 3 from the second position to the first position. According to some embodiments, the disabling device 3 may be displaced directly from the first position to the third position, in a continuous motion, by a pressing of the disabling device 3 in a direction towards the third position. In alternative embodiments, the disabling device 3 is locked from being displaced directly from the first position to the third position. In such embodiments, the disabling device 3 stops in the second position, when being displaced from the first position in a direction towards the third position. Accordingly, in such embodiments, the robotic lawnmower 1 is prevented from being transitioned directly from the deactivated state to the activated state.

FIGS. 3a-d illustrate the disabling device 3 positioned in a retainer 5 of a robotic lawnmower 1 according to some embodiments The retainer 5 comprises a first retaining arm 51 and a second retaining arm 52, wherein the first and the second retaining arms 51, 52 are connected to the button 11.

Figure 3A:
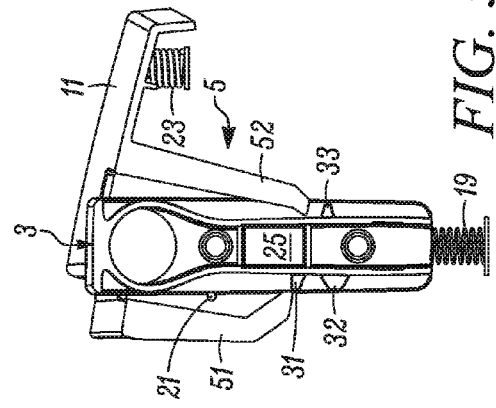
FIGS. 3a-d illustrate the disabling device positioned in a retainer of a robotic lawnmower according to some embodiments.

In FIG. 3a, the disabling device 3 is illustrated in the third position. The disabling 3 device comprises a first shoulder 31 and a second shoulder 32 and the retainer 5 comprises the first retaining arm 51. As illustrated in FIG. 3a the first retaining arm 51 is arranged to be in an abutment with the first shoulder 31 when the disabling device 3 is in the third position.

Figure 3C:
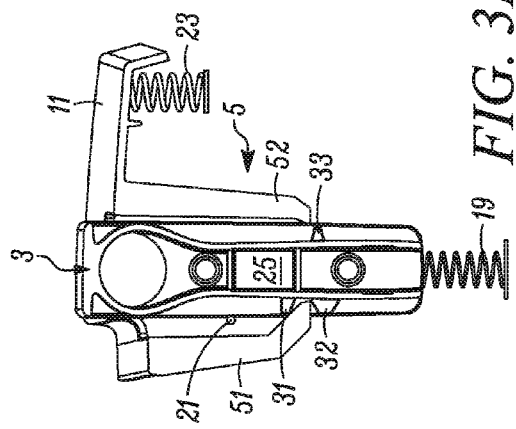
Figure 3B:
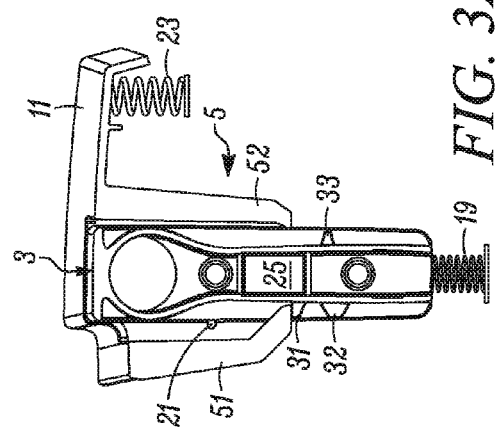
Figure 3D:
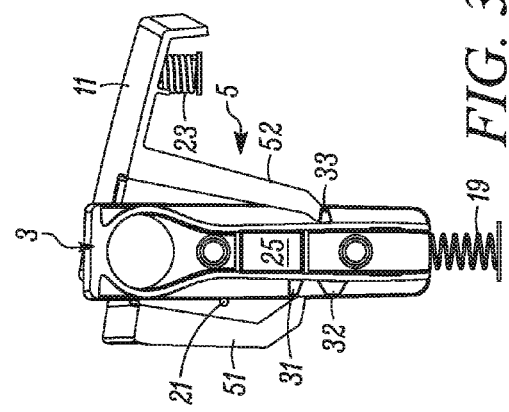

In FIG. 3d, the disabling device 3 is illustrated in the second position. As illustrated in FIG. 3d, the first retaining arm 51 is arranged to be in an abutment with the second shoulder 32 when the disabling device 3 is in the second position.

The disabling device 3 is biased by a spring 19 in a direction from the third position and the second position towards the first position. The abutment between the first retaining arm 51 and the first shoulder 31 of the disabling device 3 prevents the disabling device 3 from being displaced from the third position, by the biasing of the spring 19. Likewise, the abutment between the first retaining arm 51 and the second shoulder 32 of the disabling device 3 prevents the disabling device 3 from being displaced from the third position, by the biasing of the spring 19.

As previously stated, the first retaining arm 51 is connected to the button 11. The button 11 is hinged around a pivot axis 21 and arranged to pivot between a locking position and a releasing position. A spring 23 may bias the button 11 in a direction from the releasing position to the locking position. The button 11 is illustrated in the locking position in FIGS. 3a and 3d and in the releasing position in FIGS. 3b and 3c. As can be seen in these figures, the first retaining arm 51 is displaced in a direction from the disabling device 3 when the button is displaced from the locking position to the releasing position such that an abutment between the first retaining arm 51 and the first or second shoulder 31, 32 is released. To conclude, the first retaining arm 51 is arranged to be in an abutment with the first or second shoulder 31, 32 in the locking position, and the abutment is released when the button 11 is displaced from the locking position to the releasing position.

Consequently, when the disabling device 3 is positioned in the third position, as illustrated in FIG. 3a, and the button 11 is displaced to the releasing position, as illustrated in FIG. 3b, the abutting between the first retaining arm 51 and the first shoulder 31 is released. When the abutting is released, the disabling device 3 may be displaced, by the biasing of the spring 19, towards the second position, as illustrated in FIG. 3c.

The disabling device comprises a third shoulder 33 and the retainer 5 comprises a second retaining arm 52 connected to the button 11, wherein an abutment between the second retaining arm 52 and the third shoulder 33 prevents the disabling device 3 from being displaced directly from the third position to the first position when the button 11 is in the releasing position. As can be seen in FIG. 3c, the second retaining arm 52 is displaced in a direction towards the disabling device 3 when the button 11 is displaced from the locking position to the releasing position such that an abutment between the second retaining arm 52 and the third shoulder 33 is achieved. When the button 11 is displaced from the releasing position to the locking position, the abutment between the second retaining arm 52 and the third shoulder 33 is released, as can be seen in FIG. 3d. Since, the first retaining arm 51 is displaced in a direction towards the disabling device 3, when the button 11 is displaced from the releasing position to the locking position, abutment between the first retaining arm 51 and the second shoulder 32 is achieved. Thus, the disabling device 3 has been displaced to the second position, as illustrated in FIG. 3d.

As previously mentioned, the first retaining arm 51 is displaced in a direction from the disabling device 3 when the button 11 is displaced from the locking position to the releasing position. Accordingly, when the disabling device 3 is in the second position and the button 11 is displaced from the locking position to the releasing position, the abutment between the first retaining arm 51 and the second shoulder 32 is released. When the abutment is released, the disabling device may be displaced from the second position to the first position. Due to the disabling device 3 being at a different height in the second position than in the third position in relation to the retainer 5, an abutment between the second retaining arm 52 and the third shoulder 33 does not occur. Thus, the disabling device 3 may be displaced from the second position to the first position by the biasing of the spring 29.

Also, as can be seen in FIG. 3a-3d, the second shoulder 32 may be provided with an angled surface 34 abutting against the first retaining arm when the disabling device is positioned in the second position. The angled surface 34 may admit the disabling device 3 to be drawn out of the retainer 5, when positioned in the second position, by a force applied to the disabling device 3 in a direction towards the first position.

As illustrated in FIG. 3a, the disabling device 3 may be provided with at least one magnet 25. In such embodiments, the processing unit may be connected to at least one sensor device arranged to sense a magnetic field to thereby sense a position of the disabling device 3.

Although the invention has been described with reference to example embodiments, many different alterations, modifications and the like will become apparent for those skilled in the art. For instance, the retainer of the robotic lawnmower may comprise components capable of holding the disabling device in the first, second and third positions, other than described herein, without departing from the scope of the invention, such as a slot, a guide rail, a magnetic arrangement or other.

According to some embodiments, when the robotic lawnmower is transitioned from the stand by state to the activated state, by a displacement of the disabling device from the second position to the third position, a cutting session is started. When the cutting session is started, the robotic lawnmower may start the driving of the cutting tool. However, according to alternative embodiments, the robotic lawnmower may be provided with a second input unit, such as a button or a remote control set-up, for controlling of the robotic lawnmower. Also in these embodiments, the robotic lawnmower is transitioned from the stand by state to the activated state, by a displacement of the disabling device from the second position to the third position. However, according to these embodiments, a cutting session of the robotic lawnmower may be started via the second input unit.

As used herein, the term "comprising" or "comprises" is open-ended, and includes one or more stated features, elements, steps, components or functions but does not preclude the presence or addition of one or more other features, elements, steps, components, functions or groups thereof.

As used herein, the term "and/or" includes any and all combinations of one or more of the associated listed items.

The invention claimed is:

1. A robotic lawnmower comprising:
   a retainer; and
   a removable disabling device is arranged to be positioned in a first, a second, and a third position in the retainer, wherein the first position of the removable disabling device in the retainer constitutes an off position in which the robotic lawnmower is in, a deactivated state, the second position of the removable disabling device in the retainer constitutes a stand by position in which the robotic lawnmower is in a stand by state, and the third position of the removable disabling device in the retainer constitutes an on position in which the robotic lawnmower is in an activated state.

2. The robotic lawnmower according to claim 1, wherein the robotic lawnmower comprises a processing unit, and wherein the processing unit is connected to at least one sensor device configured to sense a position of the disabling device.

3. The robotic lawnmower according to claim 2, wherein the disabling device is equipped with at least one magnet, and wherein the at least one sensor device is a sensor device configured to sense a magnetic field.

4. The robotic lawnmower according to claim 2, wherein the processing unit is configured to gather operation data of the robotic lawnmower in the activated state.

5. The robotic lawnmower according to claim 4, wherein the processing unit is configured to save the operation data in the stand by state.

6. The robotic lawnmower according to claim 4, wherein the processing unit is configured to provide at least a part of the operation data to a user of the robotic lawnmower, via an interface, in the stand by state.

7. The robotic lawnmower according to claim 1, wherein the robotic lawnmower comprises an electric motor and a working tool, and wherein the electric motor is configured to drive the working tool in the activated state.

8. The robotic lawnmower according to claim 7, wherein the robotic lawnmower is configured to stop the driving of the working tool in the stand by state.

9. The robotic lawnmower according to claim 1, wherein the retainer is configured to lock the disabling device to the robotic lawnmower in the second and third positions of the removable disabling device in the retainer.

10. The robotic lawnmower according to claim 1, wherein the disabling device is removable from the robotic lawnmower in the first position of the removable disabling device in the retainer.

11. The robotic lawnmower according to claim 1, wherein the disabling device is biased by a spring in a direction from the third position and the second position towards the first position of the removable disabling device in the retainer.

12. The robotic lawnmower according to claim 1, wherein the robotic lawnmower comprises a button, and wherein the button is linked to the retainer such that, in the third position of the removable disabling device in the retainer, the disabling device is displaced from the third position of the removable disabling device in the retainer to the second position of the removable disabling device in the retainer when the button is pressed or touched.

13. The robotic lawnmower according to claim 12, wherein the button is linked to the retainer such that, in the second position of the removable disabling device in the retainer, the disabling device is displaced from the second position of the removable disabling device in the retainer to the first position of the removable disabling device in the retainer when the button is pressed or touched.

14. The robotic lawnmower according to claim 13, wherein the disabling device comprises a first shoulder and a second shoulder and the retainer comprises a first retaining arm arranged to be in an abutment with the first shoulder when the disabling device is in the third position of the removable disabling device in the retainer, and wherein the first retaining arm is arranged to be in an abutment with the second shoulder when the disabling device is in the second position of the removable disabling device in the retainer.

15. The robotic lawnmower according to claim 14, wherein the first retaining arm is connected to the button, and wherein the button is hinged around a pivot axis and arranged to pivot between a locking position and a releasing position, and wherein the first retaining arm is arranged to be in the abutment with the first or second shoulder in the locking position, and wherein the abutment is released when the button is displaced from the locking position to the releasing position.

16. The robotic lawnmower according to claim 15, wherein the disabling device comprises a third shoulder and the retainer comprises a second retaining arm connected to the button, and wherein an abutment between the second retaining arm and the third shoulder prevents the disabling device from being displaced directly from the third position of the removable disabling device in the retainer to the first position when the button is in the releasing position of the removable disabling device in the retainer.

* * * * *

UNITED STATES PATENT AND TRADEMARK OFFICE
CERTIFICATE OF CORRECTION

PATENT NO.        : 9,241,441 B2
APPLICATION NO.   : 14/380508
DATED             : January 26, 2016
INVENTOR(S)       : Jonathan Björn and Patrik Jägenstedt It is certified that error appears in the above-identified patent and that said Letters Patent is hereby corrected as shown below:

IN THE CLAIMS

Column 9, Claim 1, Line 17 "a removable disabling device is arranged to be positioned" should read -- a removable disabling device arranged to be positioned --.

Signed and Sealed this
Nineteenth Day of April, 2016

Michelle K. Lee
*Director of the United States Patent and Trademark Office*